(12) United States Patent
Min et al.

(10) Patent No.: US 11,107,791 B2
(45) Date of Patent: Aug. 31, 2021

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Fan-Yu Min, Kaohsiung (TW); Chao-Hung Weng, Kaohsiung (TW); Wei-Hang Tai, Kaohsiung (TW); Chen-Hung Lee, Kaohsiung (TW); Yu-Yuan Yeh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 15 days.

(21) Appl. No.: 16/354,156

(22) Filed: Mar. 14, 2019

(65) Prior Publication Data

US 2020/0294964 A1 Sep. 17, 2020

(51) Int. Cl.
*H01L 23/48* (2006.01)
*H01L 25/065* (2006.01)
(Continued)

(52) U.S. Cl.
CPC ........ *H01L 25/0652* (2013.01); *H01L 21/565* (2013.01); *H01L 23/3128* (2013.01); *H01L 23/3135* (2013.01); *H01L 23/5386* (2013.01); *H01L 23/5389* (2013.01); *H01L 24/16* (2013.01); *H01L 24/24* (2013.01); *H01L 24/81* (2013.01); *H01L 25/50* (2013.01);
(Continued)

(58) Field of Classification Search
CPC ............ H01L 23/3135; H01L 23/5386; H01L 23/5389; H01L 25/0652
USPC ......................................................... 257/738
See application file for complete search history.

(56) References Cited

U.S. PATENT DOCUMENTS

| 5,644,168 A * | 7/1997 | Libres .................. H01L 23/295 257/782 |
| 6,538,200 B2 * | 3/2003 | Moden ................ H01L 23/4951 174/522 |

(Continued)

FOREIGN PATENT DOCUMENTS

CN 103258806 A 8/2013

*Primary Examiner* — Nitin Parekh
(74) *Attorney, Agent, or Firm* — Foley & Lardner LLP

(57) ABSTRACT

A semiconductor package structure includes a conductive structure, a first semiconductor chip, a second semiconductor chip, a first encapsulant and an upper semiconductor chip. The first semiconductor chip is electrically connected to the conductive structure. The first semiconductor chip includes at least one first conductive element disposed adjacent to a second surface thereof. The second semiconductor chip is electrically connected to the conductive structure and disposed next to the first semiconductor chip. The second semiconductor chip includes at least one second conductive element disposed adjacent to a second surface thereof. The first encapsulant is disposed on the conductive structure to cover the first semiconductor chip and the second semiconductor chip. The first conductive element and the second conductive element are exposed from the first encapsulant. The upper semiconductor chip is disposed on the first encapsulant and electrically connected to the first conductive element and the second conductive element.

29 Claims, 16 Drawing Sheets

(51) Int. Cl.
*H01L 23/31* (2006.01)
*H01L 23/00* (2006.01)
*H01L 25/00* (2006.01)
*H01L 21/56* (2006.01)
*H01L 23/538* (2006.01)
*H01L 21/768* (2006.01)
*H01L 21/288* (2006.01)
*H01L 21/48* (2006.01)
*H01L 21/683* (2006.01)

(52) U.S. Cl.
CPC ........ *H01L 21/288* (2013.01); *H01L 21/4853* (2013.01); *H01L 21/6835* (2013.01); *H01L 21/76898* (2013.01); *H01L 24/32* (2013.01); *H01L 24/73* (2013.01); *H01L 24/83* (2013.01); *H01L 24/92* (2013.01); *H01L 24/97* (2013.01); *H01L 2221/68327* (2013.01); *H01L 2224/16235* (2013.01); *H01L 2224/32225* (2013.01); *H01L 2224/73204* (2013.01); *H01L 2224/92125* (2013.01); *H01L 2224/95001* (2013.01); *H01L 2924/3511* (2013.01)

(56) References Cited

U.S. PATENT DOCUMENTS

| | | | | |
|---|---|---|---|---|
| 7,417,314 | B1* | 8/2008 | Lin | H01L 24/82 257/737 |
| 8,648,479 | B2* | 2/2014 | Tabei | C08F 210/14 257/787 |
| 8,802,505 | B2* | 8/2014 | Bathan | H01L 23/562 438/127 |
| 9,171,744 | B2 | 10/2015 | Liou et al. | |
| 9,735,131 | B2* | 8/2017 | Su | H01L 25/0657 |
| 9,761,559 | B1 | 9/2017 | Shih et al. | |
| 2013/0062761 | A1* | 3/2013 | Lin | H01L 21/565 257/738 |
| 2014/0063768 | A1* | 3/2014 | Tanaka | H05K 3/36 361/784 |
| 2015/0171006 | A1* | 6/2015 | Hung | H01L 23/5384 257/774 |
| 2015/0303174 | A1* | 10/2015 | Yu | H01L 21/6835 257/712 |
| 2016/0035709 | A1* | 2/2016 | Chen | H01L 24/17 257/738 |
| 2017/0117260 | A1* | 4/2017 | Prabhu | H01L 23/3128 |
| 2020/0273839 | A1* | 8/2020 | Elsherbini | H01L 25/50 |

* cited by examiner

SEMICONDUCTOR PACKAGE STRUCTURE AND METHOD FOR MANUFACTURING THE SAME

BACKGROUND

1. Field of the Disclosure

The present disclosure relates to a semiconductor package structure and a manufacturing method, and to a semiconductor package structure including an upper semiconductor chip electrically connected to at least one lower semiconductor chip, and a method for manufacturing the semiconductor package structure.

2. Description of the Related Art

In an example semiconductor process, a redistribution structure, including several redistribution layers, is formed on a carrier. Then, a semiconductor chip is disposed on and electrically connected to the redistribution structure. A molding compound is then formed on the redistribution structure to cover the semiconductor chip. The carrier is then removed, thus forming a semiconductor package structure. However, due to coefficient of thermal expansion (CTE) mismatch between the redistribution structure and the molding compound, severe warpage may occur in such semiconductor package structure. Such warpage of the semiconductor package structure may become worse when the amount of the redistribution layers increases.

SUMMARY

In some embodiments, a semiconductor package structure includes a conductive structure, a first semiconductor chip, a second semiconductor chip, a first encapsulant and an upper semiconductor chip. The first semiconductor chip is electrically connected to the conductive structure. The first semiconductor chip has a first surface and a second surface opposite to the first surface. The first surface faces the conductive structure. The first semiconductor chip includes at least one first conductive element disposed adjacent to the second surface. The second semiconductor chip is electrically connected to the conductive structure and disposed next to the first semiconductor chip. The second semiconductor chip has a first surface and a second surface opposite to the first surface. The first surface faces the conductive structure. The second semiconductor chip includes at least one second conductive element disposed adjacent to the second surface. The first encapsulant is disposed on the conductive structure. The first encapsulant covers the first semiconductor chip and the second semiconductor chip. The first conductive element and the second conductive element are exposed from the first encapsulant. The upper semiconductor chip is disposed on the first encapsulant and electrically connected to the first conductive element and the second conductive element.

In some embodiments, a semiconductor package structure includes a conductive structure, a first semiconductor chip, a first encapsulant and an upper semiconductor chip. The first semiconductor chip is electrically connected to the conductive structure. The first semiconductor chip has a first surface and a second surface opposite to the first surface. The first surface faces the conductive structure. The first semiconductor chip includes at least one first conductive element disposed on the second surface. The first encapsulant is disposed on the conductive structure and covering the first semiconductor chip. An upper surface of the first encapsulant is substantially coplanar with an upper surface of the first conductive element. The upper semiconductor chip is disposed on the first encapsulant and electrically connected to the first conductive element.

In some embodiments, a method for manufacturing a semiconductor package structure includes (a) providing a first semiconductor chip and a second semiconductor chip, wherein the first semiconductor chip comprises at least one first conductive element, and the second semiconductor chip comprises at least one second conductive element; (b) forming a first encapsulant to cover the first semiconductor chip, the second semiconductor chip, the first conductive element and the second conductive element; (c) removing a portion of the first encapsulant to expose the first conductive element and the second conductive element; and (d) disposing an upper semiconductor chip on the first encapsulant to electrically connect the first conductive element and the second conductive element.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
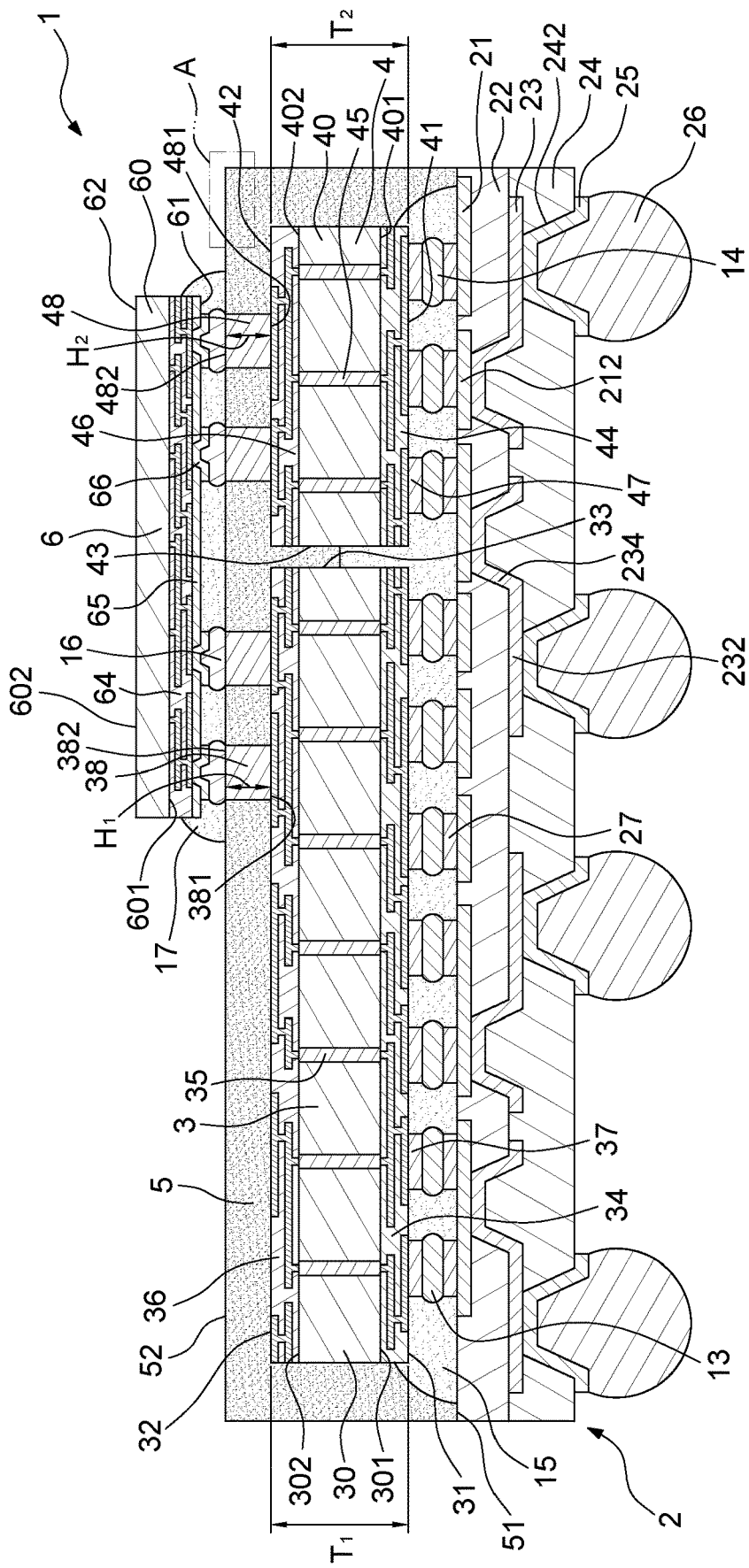
FIG. 1 illustrates a cross sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A "chip first fan-out" process includes disposing a semiconductor chip on a carrier, forming a molding compound to cover the semiconductor chip, and then forming a redistribution layer on the molding compound to electrically connect the semiconductor chip. The electrical connection between the semiconductor chip and the redistribution involves high precision, thus such process is complicated and has low yield rate. In light of such problems, a "chip last fan-out" process is developed to improve the yield rate. The chip last fan-out process includes disposing a semiconductor chip on a preformed redistribution layer on a carrier, thus the I/O pads of the semiconductor chip may be redistributed into a patterned metal layer with a larger line width/line space. The chip last fan-out process is streamlined, and thus the yield rate may be increased. Then, a molding compound may be formed to cover the semiconductor chip and the redistribution layer, thus forming a semiconductor package structure.

In an example chip last fan-out process, the redistribution layer is formed on a glass carrier. Since the CTE of the glass carrier and the redistribution layer are respectively 3 ppm/° C. and 60 ppm/° C., warpage may occur in a "smiling face" (concave shape). Accordingly, the molding compound formed thereon may be provided with a CTE close to the glass carrier (e.g., about 8 ppm/° C.) to balance such warpage. However, after the glass carrier is removed, the "smile face" (concave shape) warpage turns to "crying face" (convex shape) which adversely affects processes thereafter. To prevent such "crying face" (convex shape) warpage, a molding compound with a CTE close to the redistribution layer may be utilized, which may worsen the "smiling face" (concave shape) warpage before the removal of the glass carrier. Such "smiling face" (concave shape) warpage may result in crack of the semiconductor package structure and difficult of handling during the removal of the glass carrier.

An effective way to eliminate such warpage may be achieved by reducing the amount of the redistribution layers. For example, an additional semiconductor chip can be electrically connected to the semiconductor chip, and thus some of the redistribution layers can be omitted.

Hence, at least some embodiments of the present disclosure provide for a semiconductor package structure including an upper semiconductor chip electrically connected to at least one lower semiconductor chip. At least some embodiments of the present disclosure further provide for techniques for manufacturing the semiconductor package structure. By utilizing the upper semiconductor chip, the amount of the redistribution layers may be reduced.

FIG. 1 illustrates a cross sectional view of a semiconductor package structure 1 according to some embodiments of the present disclosure. The semiconductor package structure 1 may include a conductive structure 2, a first semiconductor chip 3, at least one first solder material 13, a second semiconductor chip 4, at least one second solder material 14, a first underfill 15, a first encapsulant 5, an upper semiconductor chip 6, a plurality of third solder materials 16 and a second underfill 17.

The conductive structure 2 may include at least one redistribution layer. For example, as shown in FIG. 1, the conductive structure 2 includes a first conductive layer 21, a first dielectric layer 22, a second conductive layer 23, a second dielectric layer 24, a plurality of under bump metallizations (UBMs) 25, a plurality of solder balls 26 and a plurality of bumps 27. The first conductive layer 21 and the second conductive layer 23 may be redistribution layers.

The first conductive layer 21 is embedded in and exposed from the first dielectric layer 22. The first conductive layer 21 may include at least one trace and a plurality of pads 212. The bumps 27 are disposed on respective ones of the pads 212. The second conductive layer 23 is disposed on the first dielectric layer 22, and may include at least one trace, a plurality of pads 232, and at least one via 234. The via 234 extends through the first dielectric layer 22 to contact the first conductive layer 21, and to electrically connect the first conductive layer 21 and the second conductive layer 23. The second dielectric layer 24 is disposed on and covers the second conductive layer 23 and the first dielectric layer 22. The second dielectric layer 24 may define a plurality of openings 242 to expose portions of the second conductive layer 23, such as the pads 232. The UBMs 25 are disposed in respective ones of the openings 242 of the second dielectric layer 24 to contact the pads 232 of the second conductive layer 23. The solder balls 26 are disposed on respective ones of the UBMs 25 for external connection. A material of the first dielectric layer 22 and/or the second dielectric layer 24 may include an insulating material, a dielectric material or a solder resist material, such as, for example, benzocyclobutene (BCB) based polymer or a polyimide (PI). In some embodiments, the material of the first dielectric layer 22 and/or the second dielectric layer 24 may include cured photoimageable dielectric (PID) materials, such as an epoxy or a PI including photoinitiators, or other resin materials. A material of the first conductive layer 21 and/or the second conductive layer 23 may include copper, another conductive metal, or an alloy thereof. The UBMs 25 may include several layers made of nickel, palladium and gold. A material of the solder balls 26 may be silver, tin, or an alloy thereof. In some embodiments, the conductive structure 2 may be a 3P3M structure (e.g., including three dielectric layers and three conductive layers), or less then 3P3M. For example, the conductive structure 2 may be a 2P2M structure, or a 1P1M structure.

The first semiconductor chip 3 is disposed on and electrically connected to the conductive structure 2. The first semiconductor chip 3 has a first surface 31, a second surface 32 opposite to the first surface 31, and a lateral surface 33 extending between the first surface 31 and the second surface 32. The first surface 31 faces the conductive structure 2. In some embodiments, the first semiconductor chip 3 may be a logic die.

The first semiconductor chip 3 may include a main body 30, a first circuit structure 34, a second circuit structure 36, at least one via 35, at least one bump 37 and at least one conductive element 38. A material of the main body 30 may include silicon or other suitable material. The main body 30 has a first surface 301 and a second surface 302 opposite to the first surface 301. The first surface 301 faces the conductive structure 2. The first circuit structure 34 is disposed on the first surface 301 of the main body 30. The first circuit structure 34 may include at least one redistribution layer. The first surface 31 of the first semiconductor chip 3 may be a surface of the first circuit structure 34. The bump 37 is disposed on and electrically connected to the first circuit structure 34. The bump 37 of the first semiconductor chip 3 is connected to one of the bumps 27 of the conductive structure 2 through the first solder material 13, thus the first semiconductor chip 3 is electrically connected to the conductive structure 2 through the bumps 37, the first solder material 13 and the bumps 27.

The second circuit structure 36 is disposed on the second surface 302 of the main body 302. The second circuit structure 36 may include at least one redistribution layer. The second surface 32 of the first semiconductor chip 3 may be a surface of the second circuit structure 36. The first conductive element 38 is disposed adjacent to the second surface 32 of the first semiconductor chip 3. For example, the first conductive element 38 has a first surface 381 and a second surface 382 opposite to the first surface 381. The first surface 381 is disposed on and electrically connected to the second circuit structure 36. The second surface 382 is an upper surface as shown in FIG. 1. The first conductive element 38 may be a conductive bump, and may be made of copper. In one embodiment, the first conductive element 38 may be a monolithic structure. The via 35 extends through the main body 30, and electrically connects the first circuit structure 34 and the second circuit structure 36.

The second semiconductor chip 4 is disposed on and electrically connected to the conductive structure 2. As shown in FIG. 1, the second semiconductor chip 4 is disposed next to the first semiconductor chip 3. The second semiconductor chip 4 and the first semiconductor chip 3 are disposed on the conductive structure 2 side by side. The second semiconductor chip 4 has a first surface 41, a second surface 42 opposite to the first surface 41, and a lateral surface 43 extending between the first surface 41 and the second surface 42. The first surface 41 faces the conductive structure 2. The lateral surface 43 of the second semiconductor chip 4 faces the lateral surface 33 of the first semiconductor chip 3. In some embodiments, the second semiconductor chip 4 may be a logic die.

Similar to the first semiconductor chip 3, the second semiconductor chip 4 may also include a main body 40, a first circuit structure 44, a second circuit structure 46, at least one via 45, at least one bump 47 and at least one conductive element 48. A material of the main body 40 may include silicon or other suitable material. The main body 40 has a first surface 401 and a second surface 402 opposite to the first surface 401. The first surface 401 faces the conductive structure 2. The first circuit structure 44 is disposed on the first surface 401 of the main body 40. The first circuit structure 44 may include at least one redistribution layer. The first surface 41 of the second semiconductor chip 4 may be a surface of the first circuit structure 44. The bump 47 is disposed on and electrically connected to the first circuit structure 44. The bump 47 of the second semiconductor chip 4 is connected to another one of the bumps 27 of the conductive structure 2 through the second solder material 14, thus the second semiconductor chip 4 is electrically connected to the conductive structure 2 through the bumps 47, the second solder material 14 and the bumps 27.

The second circuit structure 46 is disposed on the second surface 402 of the main body 40. The second circuit structure 46 may include at least one redistribution layer. The second surface 42 of the second semiconductor chip 4 may be a surface of the second circuit structure 46. The second conductive element 48 is disposed adjacent to the second surface 42 of the second semiconductor chip 4. For example, the second conductive element 48 has a first surface 481 and a second surface 482 opposite to the first surface 481. The first surface 481 is disposed on and electrically connected to the second circuit structure 46. The second surface 482 is an upper surface as shown in FIG. 1. The second conductive element 48 may be a conductive bump, and may be made of copper. In one embodiment, the second conductive element 48 may be a monolithic structure. The via 45 extends through the main body 40 to electrically connect the first circuit structure 44 and the second circuit structure 46.

The functions and/or the sizes of the first semiconductor chip 3 and the second semiconductor chip 4 may be the same, or may be different from each other. As shown in FIG. 1, a thickness $T_1$ of the first semiconductor chip 3 and a thickness $T_2$ of the second semiconductor chip 4 may substantially be the same. A height $H_1$ of the first conductive element 38 and a height $H_2$ of the second conductive element 48 may substantially be the same. However, the thickness $T_1$ of the first semiconductor chip 3 and the height $H_1$ of the first conductive element 38 may be different from the thickness $T_2$ of the second semiconductor chip 4 and the height $H_2$ of the second conductive element 48 in other embodiments.

The first underfill 15 is disposed and filled between the first semiconductor chip 3 and the conductive structure 2 to cover and protect the bumps 37, the first solder material 13 and the bumps 27, and between the second semiconductor chip 4 and the conductive structure 2 to cover and protect the bumps 47, the second solder material 14 and the bumps 27. The first underfill 15 may further include a portion disposed between the first semiconductor chip 3 and the second semiconductor chip 4, such as between the lateral surface 33 of the first semiconductor chip 3 and the lateral surface 43 of the second semiconductor chip 4.

The first encapsulant 5 is disposed on the conductive structure 2, and covers the first semiconductor chip 3, the second semiconductor chip 4 and the first underfill 15. For example, the first encapsulant 5 encapsulates the first semiconductor chip 3 and the second semiconductor chip 4. The first encapsulant 5 has a first surface 51 and a second surface 52. The first surface 51 is disposed on and contacts the conductive structure 2. The second surface 52 is an upper surface as shown in FIG. 1. A material of the first encapsulant 5 may be a molding compound with or without fillers. A portion of the first encapsulant 5 is disposed between the first semiconductor chip 3 and the second semiconductor chip 4, and contacts the portion of the first underfill 15 disposed between the first semiconductor chip 3 and the second semiconductor chip 4. That is, the first encapsulant 5 and the first underfill 15 jointly fill a space between the lateral surface 33 of the first semiconductor chip 3 and the lateral surface 43 of the second semiconductor chip 4. In some embodiments, the first underfill 15 may be omitted. Thus, the first encapsulant 5 is further disposed and filled between the first semiconductor chip 3 and the conductive structure 2, between the second semiconductor chip 4 and the conductive structure 2, and between the first semiconductor chip 3 and the second semiconductor chip 4.

The first conductive element 38 and the second conductive element 48 are embedded in and exposed from the first encapsulant 5. For example, the upper surface (e.g., the second surface 381) of the first conductive element 38 and the upper surface (e.g., the second surface 481) of the second conductive element 48 are exposed form the first encapsulant 5. The upper surface (e.g., the second surface 52) of the first encapsulant 5 is substantially coplanar with an upper surface (e.g., the second surface 381) of the first conductive element 38 and an upper surface (e.g., the second surface 481) of the second conductive element 48.

The upper semiconductor chip 6 is disposed on the first encapsulant 5 and electrically connected to the first conductive element 38 and the second conductive element 48. The upper semiconductor chip 6 has a first surface 61 and a second surface 62 opposite to the first surface 61. The first surface 61 faces the first encapsulant 5. In some embodiments, the upper semiconductor chip 6 may be a memory die and/or a bridge die.

The upper semiconductor chip 6 may include a main body 60, a circuit structure 64, a protection layer 65 and a plurality of UBMs 66. A material of the main body 60 may include silicon or other suitable material. The main body 60 has a first surface 601 and a second surface 602 opposite to the first surface 601. The first surface 601 faces the first encapsulant 5. The second surface 602 of the main body 60 may be the second surface 62 of the upper semiconductor chip 6. The circuit structure 64 is disposed on the first surface 601 of the main body 60. The circuit structure 64 may include at least one redistribution layer. The protection layer 65 is disposed on and covers the circuit structure 64, and exposes portions of the circuit structure 64. The UBMs 66 are disposed on the exposed portions of the circuit structure 64. At least one of the UBMs 66 is connected to the first conductive element 38 through one of the third solder materials 16, thus the upper semiconductor chip 6 is electrically connected to the first semiconductor chip 3 through the UBMs 66, the third solder materials 16 and the first conductive element 38. At least another one of the UBMs 66 is connected to the second conductive element 48 through another one of the third solder materials 16, thus the upper semiconductor chip 6 is electrically connected to the second semiconductor chip 4 through the UBMs 66, the third solder materials 16 and the second conductive element 48. The second underfill 17 is disposed between the upper semiconductor chip 6 and the first encapsulant 5 to cover and protect the UBMs 66 and the solder materials 16.

Figure 2:
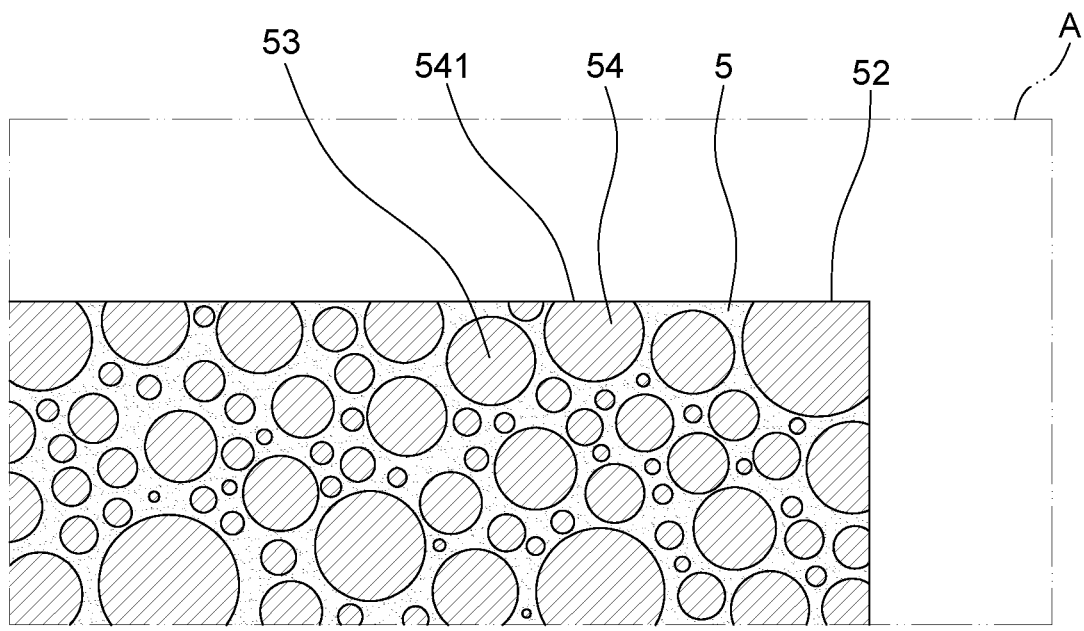
FIG. 2 illustrates an enlarged view of an area "A" shown in FIG. 1.

FIG. 2 illustrates an enlarged view of an area "A" shown in FIG. 1. As shown in FIG. 2, the first encapsulant 5 may include a plurality of fillers 53, 54. During a manufacturing process of the semiconductor package structure 1, the first encapsulant 5 may be grinded. Thus, some of the fillers 54 disposed adjacent to the upper surface (e.g., the second surface 52) of the first encapsulant 5 may be cut or truncated. For example, the first encapsulant 5 may include a plurality of truncated fillers 54 exposed on the upper surface (e.g., the second surface 52) of the first encapsulant 5. Each of the truncated fillers 54 may have a substantially flat surface 541, and the surfaces 541 of the truncated fillers 54 are substantially coplanar with each other. The surfaces 541 of the truncated fillers 54 may further be substantially coplanar with the upper surface (e.g., the second surface 52) of the first encapsulant 5.

Since the upper semiconductor chip 6 electrically connects the first semiconductor chip 3 and the second semiconductor chip 4, an amount of redistribution layers in the conductive structure 2 can be reduced. For example, the conductive structure 2 may be composed of three or less than three redistribution layers. Thus, the conductive structure 2 may include up to two redistribution layers or one redistribution layer. As a result, the thickness of the conductive structure 2 is reduced accordingly, and the CTE mismatch between the conductive structure 2 and the first encapsulant 5 is reduced. Besides, since the first encapsulant 5 covers and protects the first conductive element 38 and the second conductive element 48, the upper semiconductor chip 6 may be connected to the first conductive element 38 and the second conductive element 48 properly, and may not damage the first conductive element 38 and the second conductive element 48. Even the upper semiconductor chip 6 may tilt during the die-mounting process, the upper semiconductor chip 6 may hit the first encapsulant 5 rather than the first conductive element 38 and the second conductive element 48. In a comparative example, the first encapsulant 5 is omitted, thus damages of the first conductive element 38 and the second conductive element 48 (such as crack or collapse) may easily occur when connecting to the upper semiconductor chip 6. This is because the upper semiconductor chip 6 may tilt to hit the first conductive element 38 and the second conductive element 48 during the die-mounting process.

Figure 3:
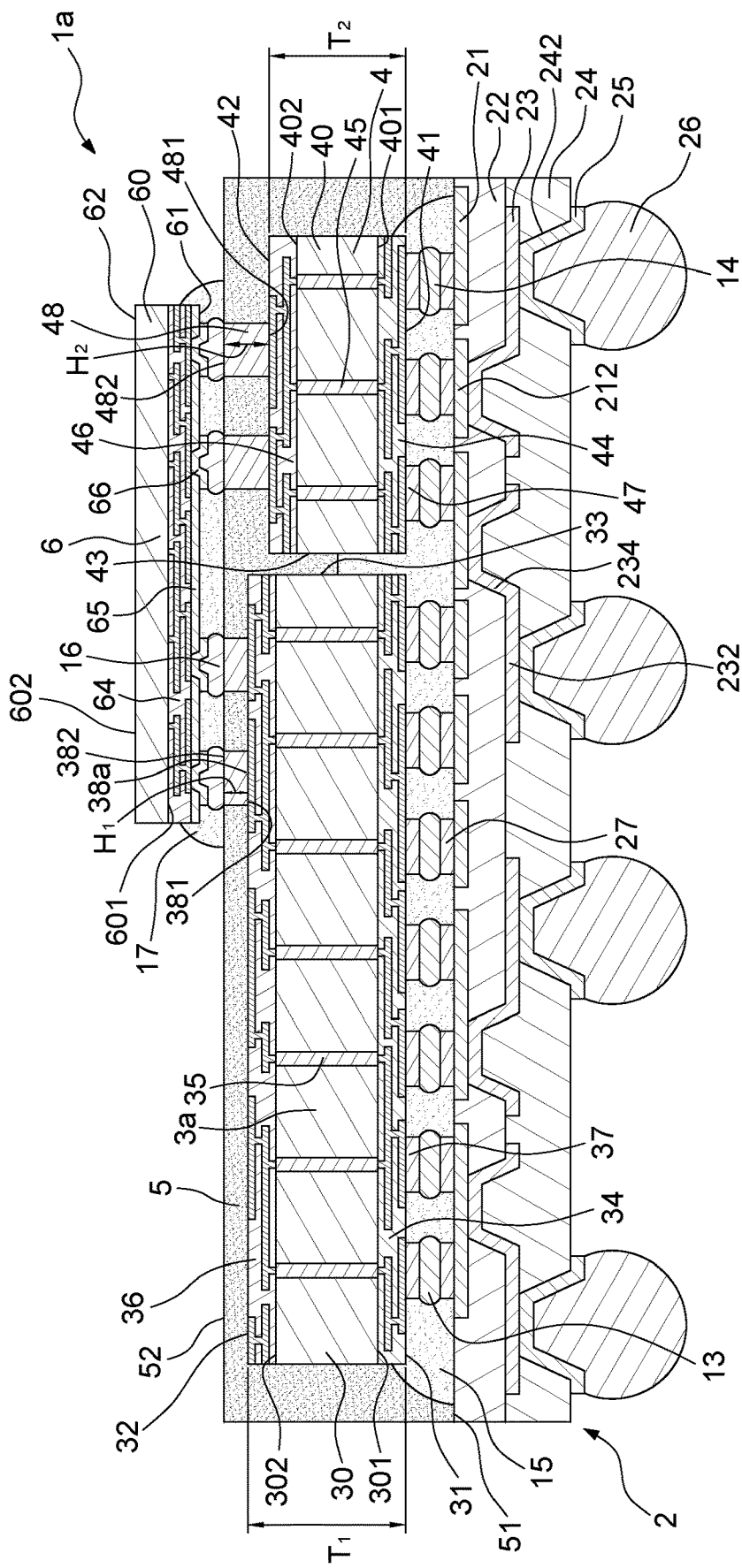
FIG. 3 illustrates a cross sectional view of an example of a semiconductor package structure according to some embodiments of the present disclosure.

FIG. 3 illustrates a cross sectional view of an example of a semiconductor package structure 1a according to some embodiments of the present disclosure. The semiconductor package structure 1a is similar to the semiconductor package structure 1 shown in FIG. 1, except for the first semiconductor chip 3a and the first conductive element 38a.

As shown in FIG. 3, the semiconductor the thickness $T_1$ of the first semiconductor chip 3a is not equal to the thickness $T_2$ of the second semiconductor chip 4. For example, the upper surface (e.g., the second surface 32) of the first semiconductor chip 3a and the upper surface (e.g., the second surface 42) of the second semiconductor chip 4 are not at the same level from the conductive structure 2. The semiconductor the thickness $T_1$ of the first semiconductor chip 3a may be greater than the thickness $T_2$ of the second semiconductor chip 4. Besides, the height $H_1$ of the first conductive element 38a is not equal to the height $H_2$ of the second conductive element 48. The height $H_1$ of the first conductive element 38a may be less than the height $H_2$ of the second conductive element 48. However, the upper surface (e.g., the second surface 382) of the first conductive element 38a remains substantially coplanar with the upper surface (e.g., the second surface 482) of the second conductive element 48.

Figure 4:
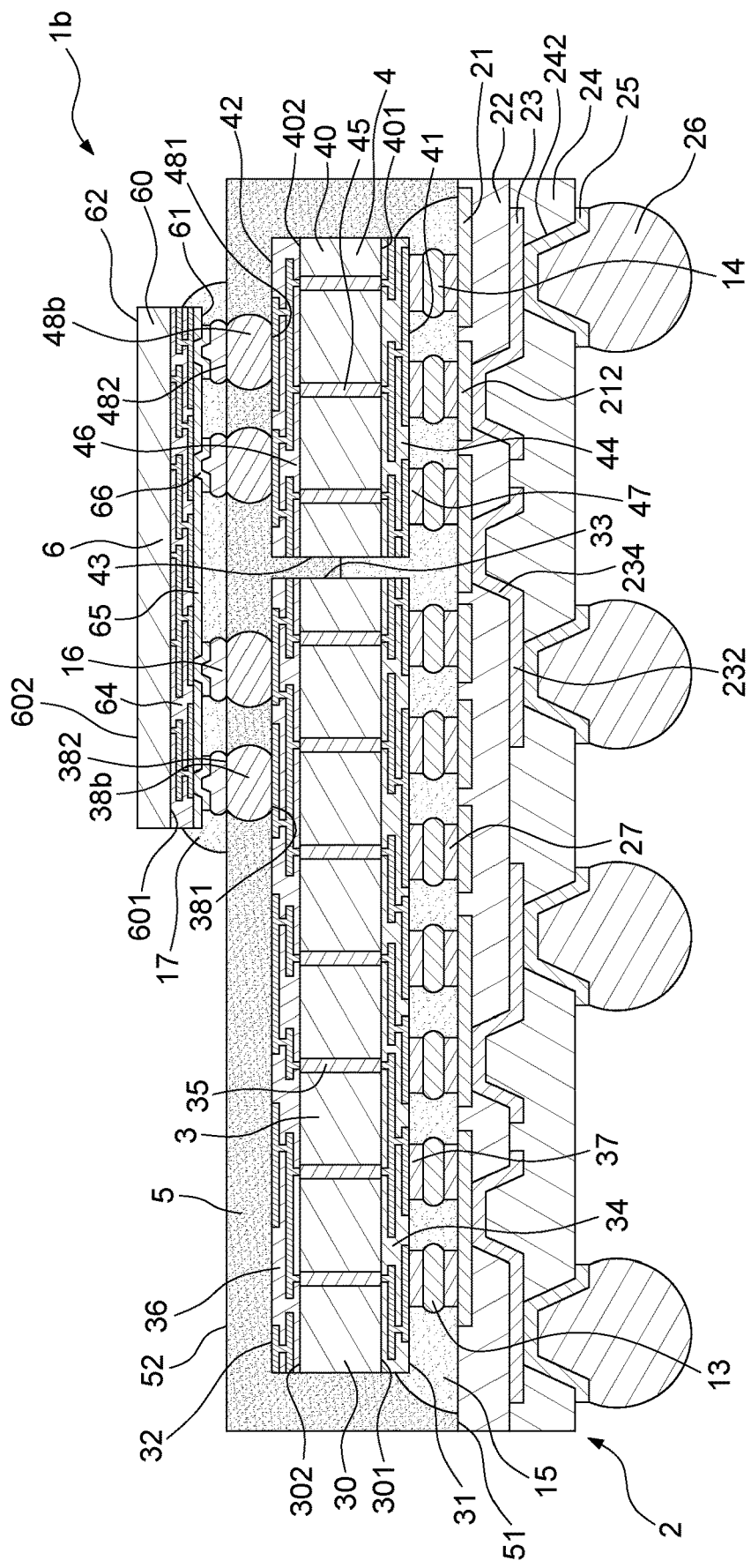
FIG. 4 illustrates a cross sectional view of an example of a semiconductor package structure according to some embodiments of the present disclosure.

FIG. 4 illustrates a cross sectional view of an example of a semiconductor package structure 1b according to some embodiments of the present disclosure. The semiconductor package structure 1b is similar to the semiconductor package structure 1 shown in FIG. 1, except that the first conductive element 38b and the second conductive elements 48b are solder balls.

Figure 5:
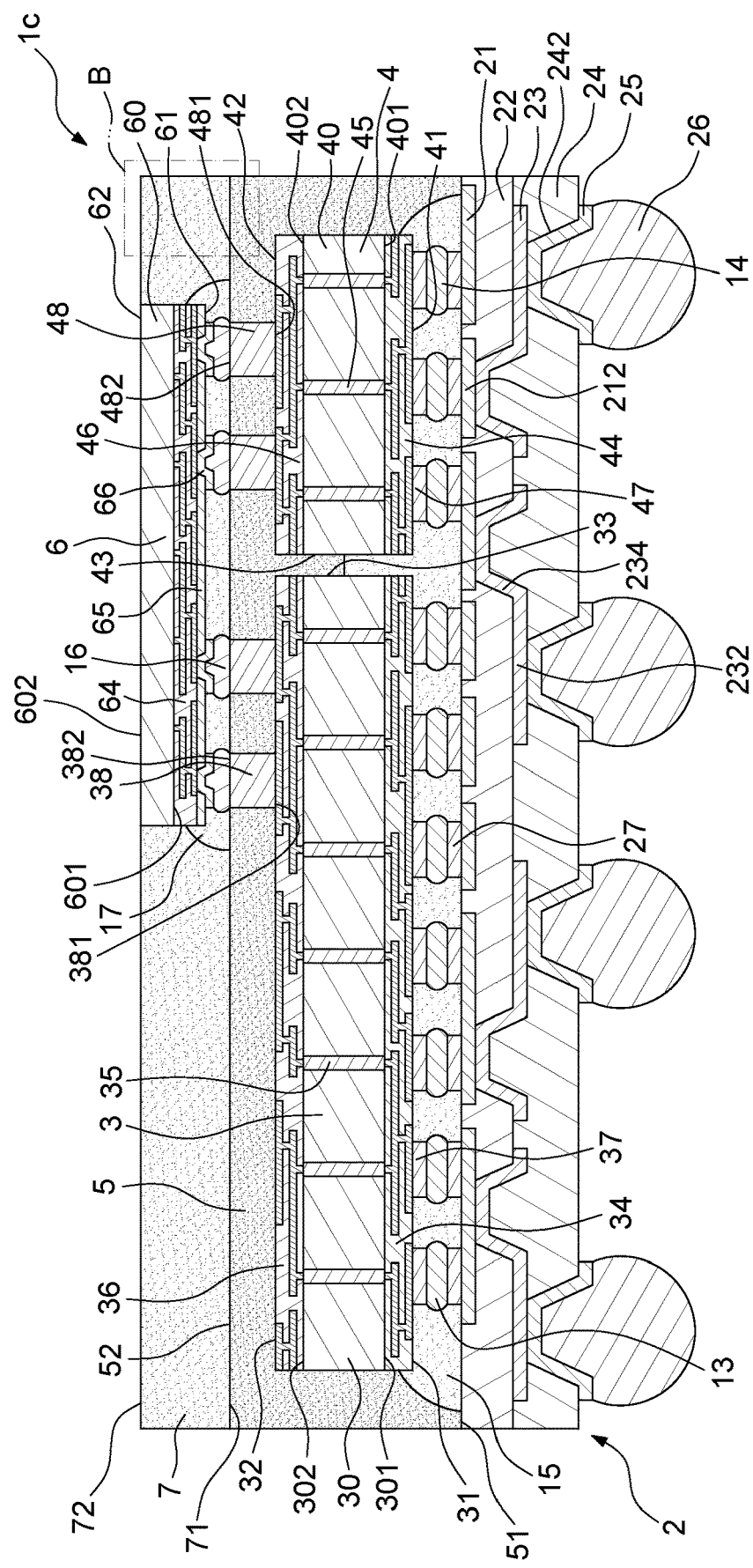
FIG. 5 illustrates a cross sectional view of an example of a semiconductor package structure according to some embodiments of the present disclosure.

FIG. 5 illustrates a cross sectional view of an example of a semiconductor package structure 1c according to some embodiments of the present disclosure. The semiconductor package structure 1c is similar to the semiconductor package structure 1 shown in FIG. 1, but further includes a second encapsulant 7.

As shown in FIG. 5, the second encapsulant 7 is disposed on the upper surface (e.g., the second surface 52) of the first encapsulant 5, and covers the upper semiconductor chip 6 and the first encapsulant 5. There is a boundary between the first encapsulant 5 and the second encapsulant 7. The second encapsulant 7 has a first surface 71 and a second surface 72 opposite to the first surface 71. The first surface 71 of the second encapsulant 7 is disposed on and contacts the upper surface (e.g., the second surface 52) of the first encapsulant 5. The second surface 72 is an upper surface as shown in FIG. 5. The upper surface (e.g., the second surface 72) of the second encapsulant 7 is substantially coplanar with the upper surface (e.g., the second surface 62) of the upper semiconductor chip 6. A material of the second encapsulant 7 may be a molding compound with or without fillers. The material of the second encapsulant 7 may be the same as or different from the material of the first encapsulant 5. In some embodiments, a coefficient of thermal expansion (CTE) of the material of the second encapsulant 7 may be different from the CTE of the material of the first encapsulant 5, so as to balance the warpage due to the CTE mismatch between the conductive structure 2 and the first encapsulant 5.

Figure 6:
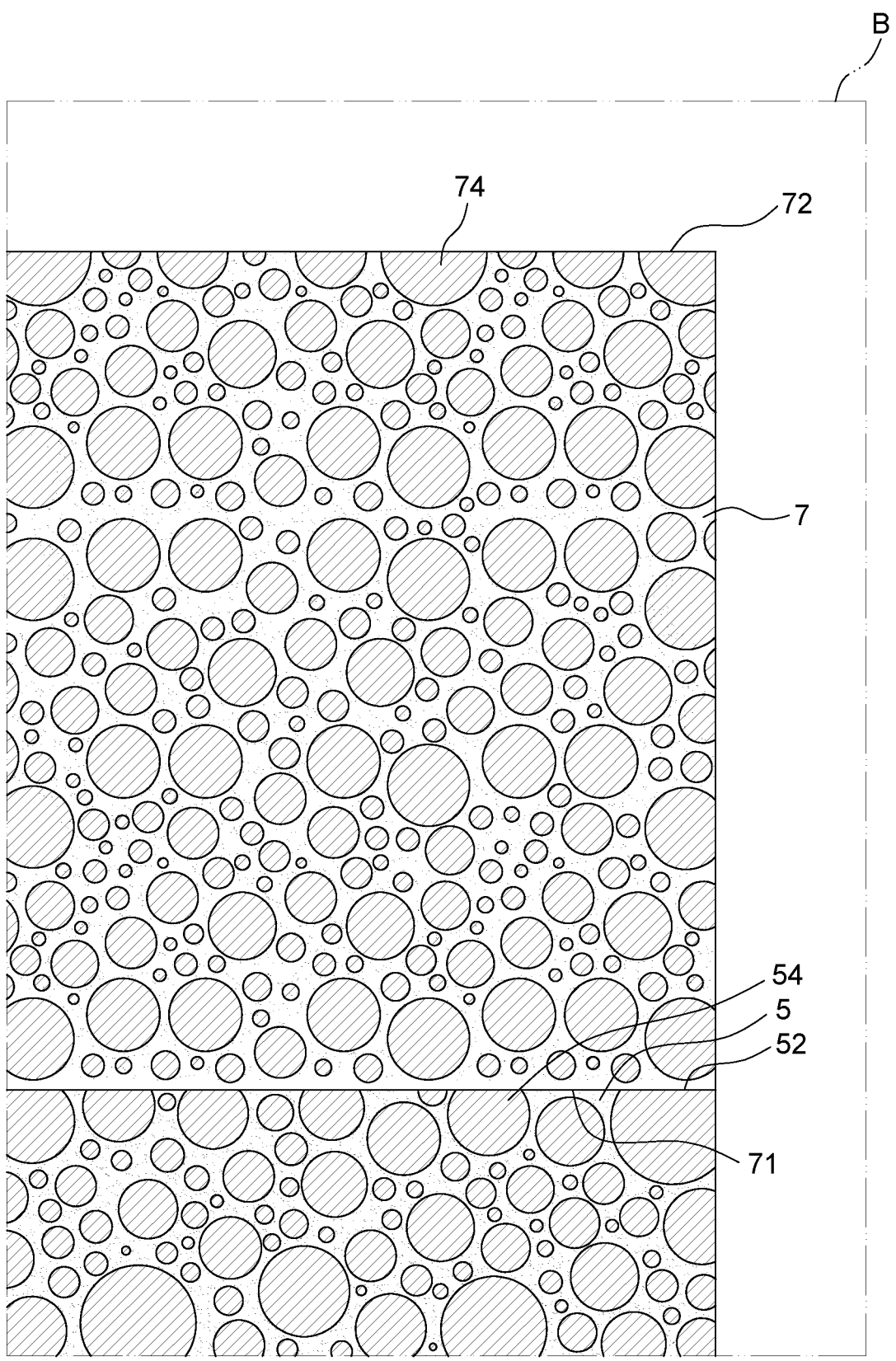
FIG. 6 illustrates an enlarged view of an area "B" shown in FIG. 5.

FIG. 6 illustrates an enlarged view of an area "B" shown in FIG. 5. Similar to the first encapsulant 5, the second encapsulant 7 also includes a plurality of truncated fillers 74 exposed on the upper surface (e.g., the second surface 72) of the first encapsulant 7.

Figure 7:
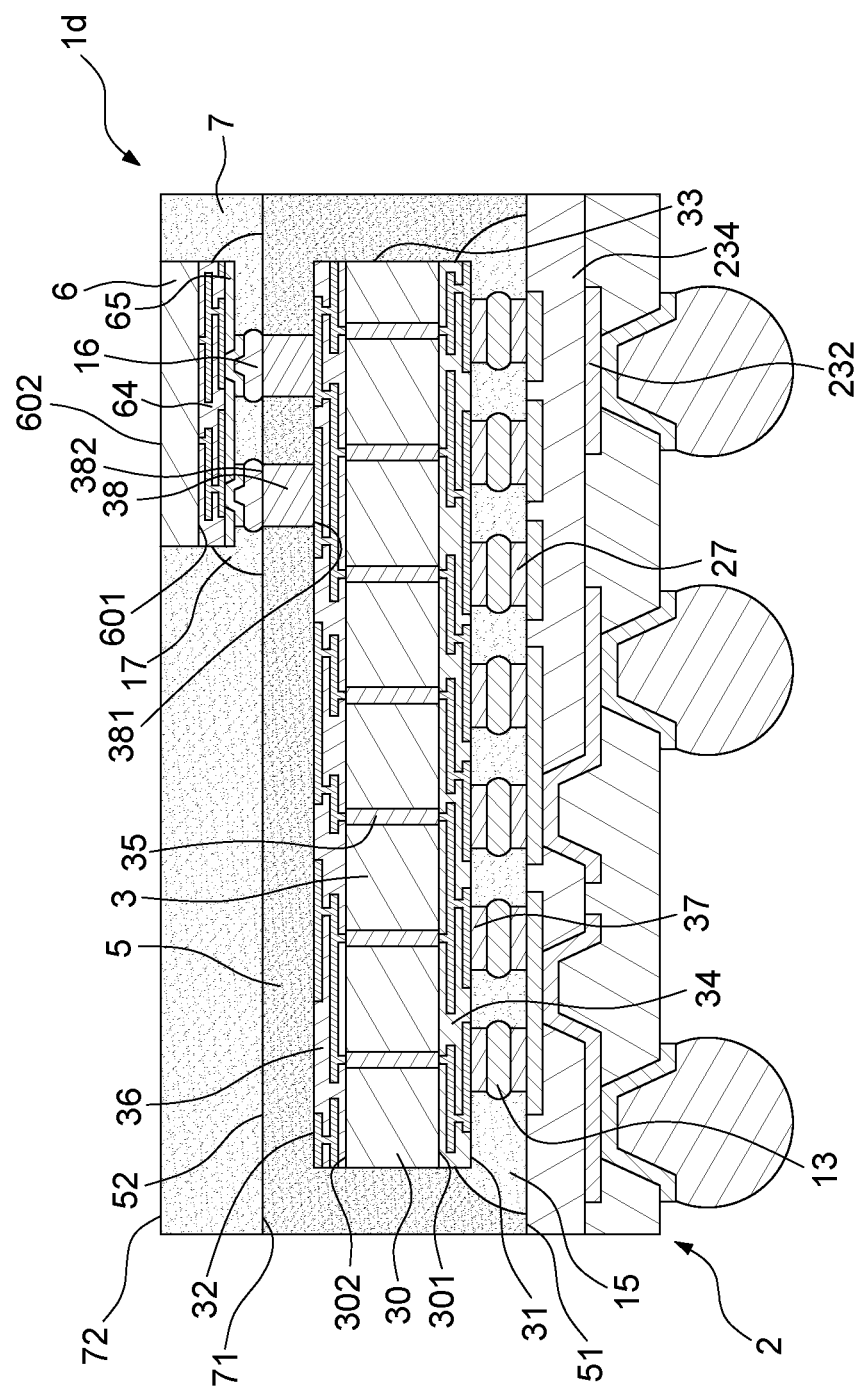
FIG. 7 illustrates a cross sectional view of an example of a semiconductor package structure according to some embodiments of the present disclosure.

FIG. 7 illustrates a cross sectional view of an example of a semiconductor package structure 1d according to some embodiments of the present disclosure. The semiconductor package structure 1d is similar to the semiconductor package structure 1c shown in FIG. 5, except that the second semiconductor chip 4 is omitted. In some embodiments, the upper semiconductor chip 6 in the semiconductor package structure 1d may be a memory die or an integrated passive device.

FIG. 8 through FIG. 15 illustrate a method for manufacturing a semiconductor device structure according to some embodiments of the present disclosure. In some embodiments, the method is for manufacturing the semiconductor package structure 1 shown in FIG. 1.

Figure 8:
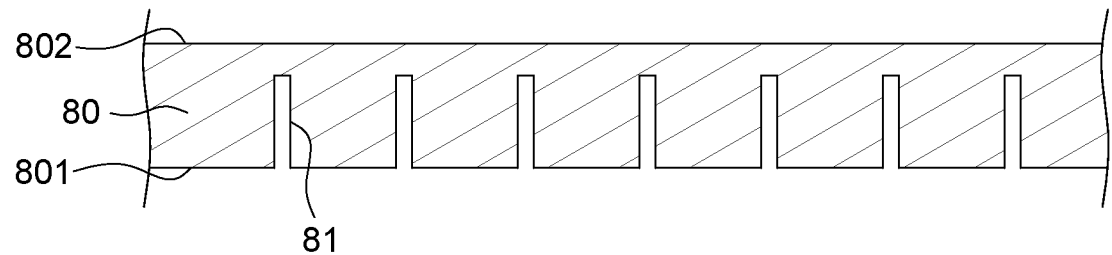
FIG. 8 illustrates one or more stages of an example of a method for manufacturing a semiconductor package structure according to some embodiments of the present disclosure.

Referring to FIG. 8, a wafer 80 is provided. The wafer 80 may be made of silicon, and may be manufactured through the following stages into a main body of a semiconductor chip, such as the main body 30 of the first semiconductor chip 3 shown in FIG. 1. The wafer 80 has a first surface 801 and a second surface 802 opposite to the first surface 801. At least one via hole 81 is formed on and recessed from the first surface 801 of the wafer 80.

Figure 9:
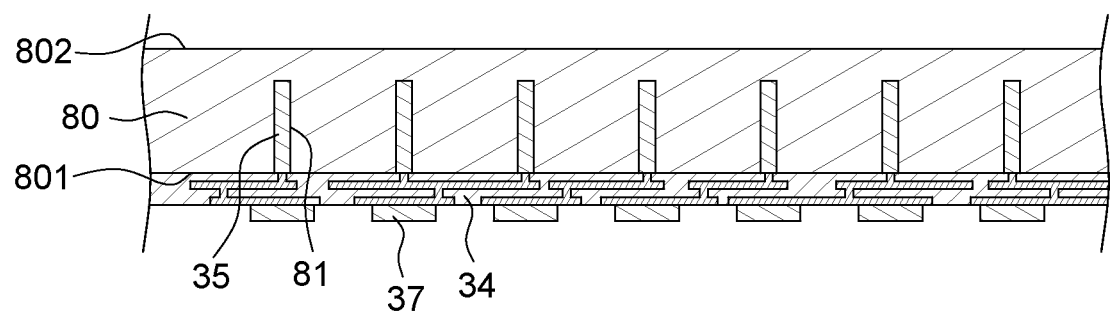
FIG. 9 illustrates one or more stages of an example of a method for manufacturing a semiconductor package structure according to some embodiments of the present disclosure.

Referring to FIG. 9, a via 35 is formed in the via hole 81 by, for example, plating. Then, a first circuit structure 34 is formed on the first surface 801 of the wafer 80, and is electrically connected to the via 35. Then, at least one bump 37 is formed on the first circuit structure 34 by, for example, plating with a patterned photoresist.

Figure 10:
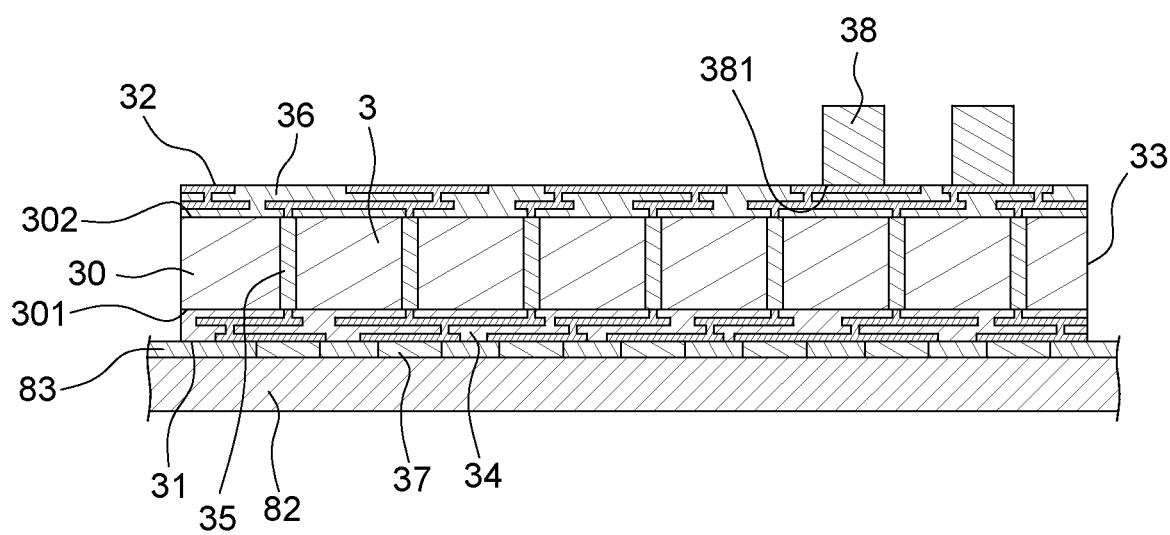
FIG. 10 illustrates one or more stages of an example of a method for manufacturing a semiconductor package structure according to some embodiments of the present disclosure.

Referring to FIG. 10, the first circuit structure 34 is attached to a carrier 82 through an adhesive 83. Then, the wafer 80 is grinded from the second surface 802 to expose the via 35, thus forming a main body 30. The main body 30 has a first surface 301 (e.g., the first surface 801 of the wafer 80) and a second surface 302 opposite to the first surface 301. The first circuit structure 34 is disposed on the first surface 301 of the main body 30. Then, a second circuit 36 is formed on the second surface 302 of the main body 30, and electrically connected to the first circuit structure 34 through the via 35. Then, at least one conductive element 38 is disposed on the second circuit structure 36. Then, a singulation process is conducted to form at least one first semiconductor chip 3. For example, the conductive element 38 has a first surface 381 disposed on and electrically connected to the second circuit structure 36. The first semiconductor chip 3 has a first surface 31, a second surface 32 opposite to the first surface 31, and a lateral surface 33 extending between the first surface 31 and the second surface 32. The first surface 31 may be a surface of the first circuit structure 34, and the second surface 32 may be a surface of the second circuit structure 36. The conductive element 38 is disposed adjacent to the second surface 32 of the first semiconductor chip 3.

Figure 11:
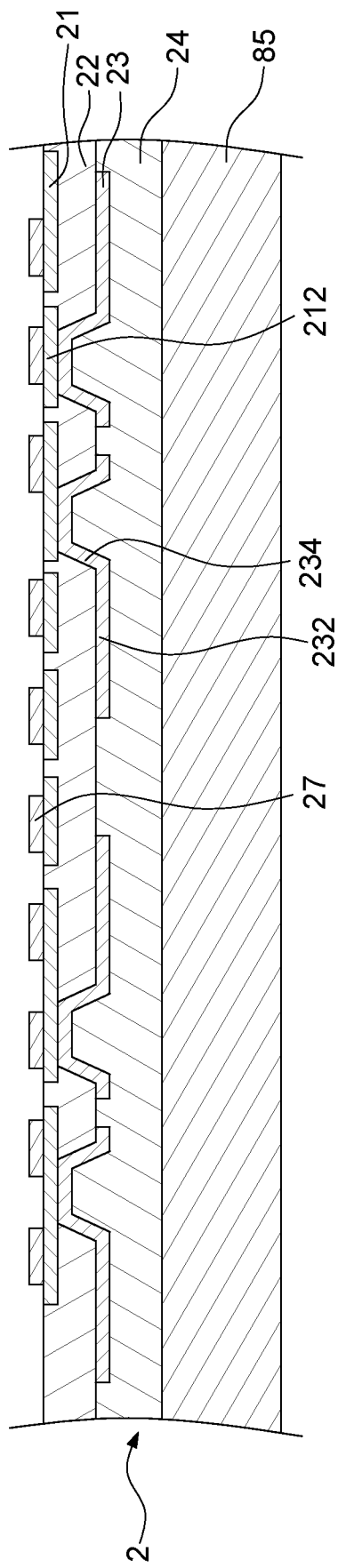
FIG. 11 illustrates one or more stages of an example of a method for manufacturing a semiconductor package structure according to some embodiments of the present disclosure.

Referring to FIG. 11, a carrier 85 is provided, and a conductive structure 2 is formed or disposed thereon. The conductive structure 2 may include at least one redistribution layer. For example, the conductive structure 2 includes a first conductive layer 21, a first dielectric layer 22, a second conductive layer 23, a second dielectric layer 24 and a plurality of bumps 27. The first conductive layer 21 and the second conductive layer 23 may be redistribution layers.

The first conductive layer 21 is embedded in and exposed from the first dielectric layer 22. The first conductive layer 21 may include at least one trace and a plurality of pads 212. The bumps 27 are disposed on respective ones of the pads 212. The second conductive layer 23 is disposed on the first dielectric layer 22, and may include at least one trace, a plurality of pads 232, and at least one via 234. The via 234 extends through the first dielectric layer 22 to contact the first conductive layer 21, and to electrically connect the first conductive layer 21 and the second conductive layer 23. The second dielectric layer 24 is disposed on and covers the second conductive layer 23 and the first dielectric layer 22. The second dielectric layer 24 is attached to the carrier 85.

Figure 12:
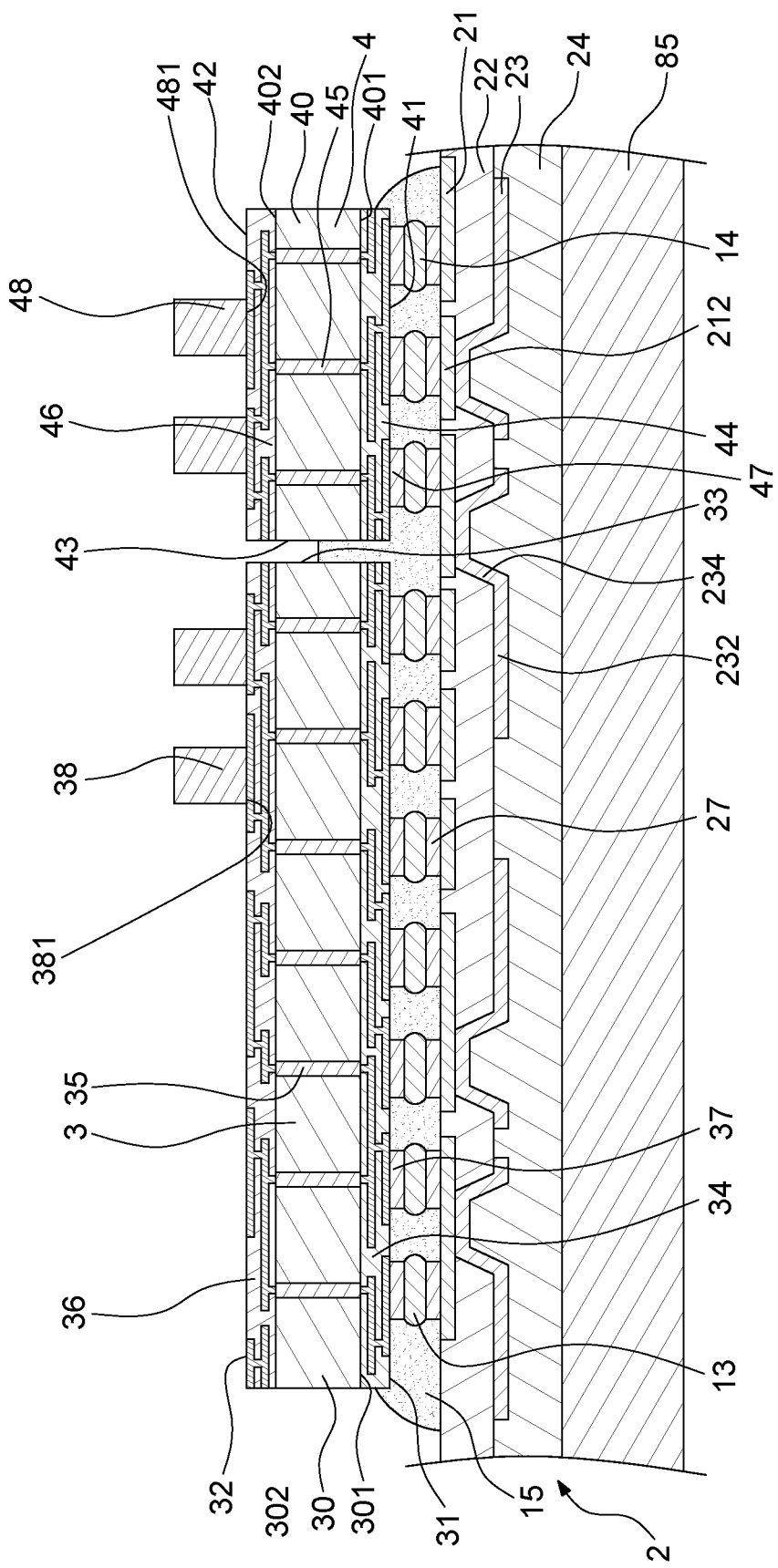
FIG. 12 illustrates one or more stages of an example of a method for manufacturing a semiconductor package structure according to some embodiments of the present disclosure.

Referring to FIG. 12, the first semiconductor chip 3 and a second semiconductor chip 4 are provided and disposed on the conductive structure 2.

For example, the first semiconductor chip 3 is disposed on the conductive structure 2, with the first surface 31 thereof facing the conductive structure 2. The bump 37 of the first semiconductor chip 3 is connected to one of the bumps 27 of the conductive structure 2 through the first solder material 13, thus the first semiconductor chip 3 is electrically connected to the conductive structure 2.

The second semiconductor chip 4 may be manufactured as the stages illustrated in FIG. 8 to FIG. 10. The second semiconductor chip 4 has a first surface 41, a second surface 42 opposite to the first surface 41, and a lateral surface 43 extending between the first surface 41 and the second surface 42. Similar to the first semiconductor chip 3, the second semiconductor chip 4 may also include a main body 40, a first circuit structure 44, a second circuit structure 46, at least one via 45, at least one bump 47 and at least one conductive element 48. The main body 40 has a first surface 401 and a second surface 402 opposite to the first surface 401. The first circuit structure 44 is disposed on the first surface 401 of the main body 40. The bump 47 is disposed on and electrically connected to the first circuit structure 44. The second circuit structure 46 is disposed on the second surface 402 of the main body 40. The second conductive element 48 is disposed adjacent to the second surface 42 of the second semiconductor chip 4. For example, the second conductive element 48 has a first surface 481 disposed on and electrically connected to the second circuit structure 46. The via 45 extends through the main body 40 to electrically connect the first circuit structure 44 and the second circuit structure 46.

The second semiconductor chip 4 is also disposed on the conductive structure 2 with the first surface 41 thereof facing the conductive structure 2. The bump 47 of the second semiconductor chip 4 is connected to another one of the bumps 27 of the conductive structure through the second solder material 14, thus the second semiconductor chip 4 is electrically connected to the conductive structure 2. As shown in FIG. 12, the second semiconductor chip 4 is disposed next to the first semiconductor chip 3. The second semiconductor chip 4 and the first semiconductor chip 3 are disposed on the conductive structure 2 side by side. The lateral surface 43 of the second semiconductor chip 4 faces the lateral surface 33 of the first semiconductor chip 3.

Then, an underfill 15 is disposed and filled between the first semiconductor chip 3 and the conductive structure 2, and between the second semiconductor chip 4 and the conductive structure 2. A portion of the first underfill 15 may extend into a space between the first semiconductor chip 3 and the second semiconductor chip 4, such as the space between the lateral surface 33 of the first semiconductor chip 3 and the lateral surface 43 of the second semiconductor chip 4.

Figure 13:
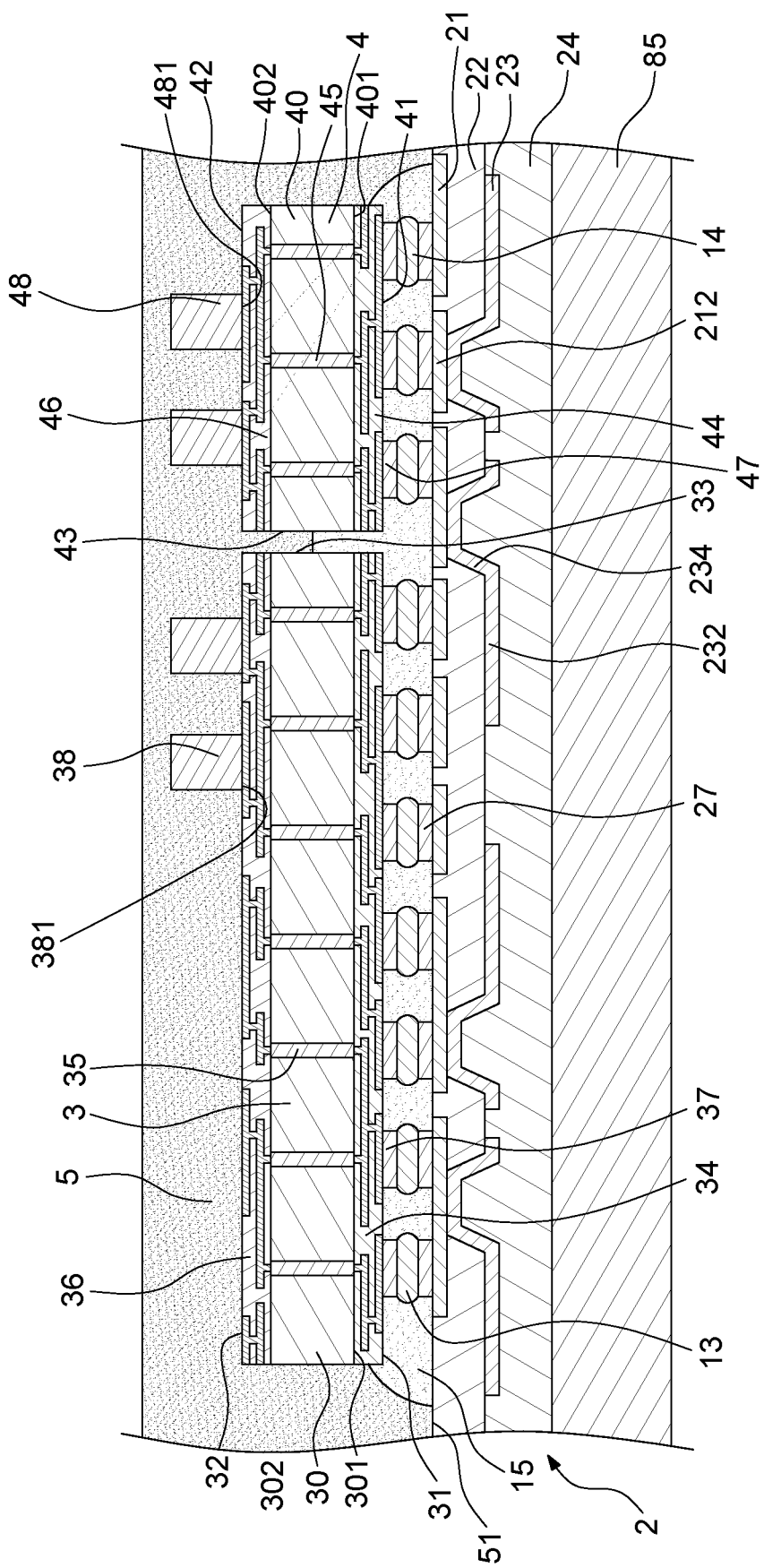
FIG. 13 illustrates one or more stages of an example of a method for manufacturing a semiconductor package structure according to some embodiments of the present disclosure.

Referring to FIG. 13, a first encapsulant 5 is formed to cover the first semiconductor chip 3, the second semiconductor chip 4, the first conductive element 38 and the second conductive element 48. The first encapsulant 5 has a first surface 51 disposed on the conductive structure 2. The first encapsulant 5 completely covers the first conductive element 38 and the second conductive element 48. A portion of the first encapsulant 5 extends into a space between the first semiconductor chip 3 and the second semiconductor chip 4. The portion of the first encapsulant 5 may contact the portion of the first underfill 15 disposed between the first semiconductor chip 3 and the second semiconductor chip 4. That is, the first encapsulant 5 and the first underfill 15 jointly fill the space between the lateral surface 33 of the first semiconductor chip 3 and the lateral surface 43 of the second semiconductor chip 4. Since the first encapsulant 5 can enter the space between the first semiconductor chip 3 and the second semiconductor chip 4 directly, problem of void can be reduced.

Figure 14:
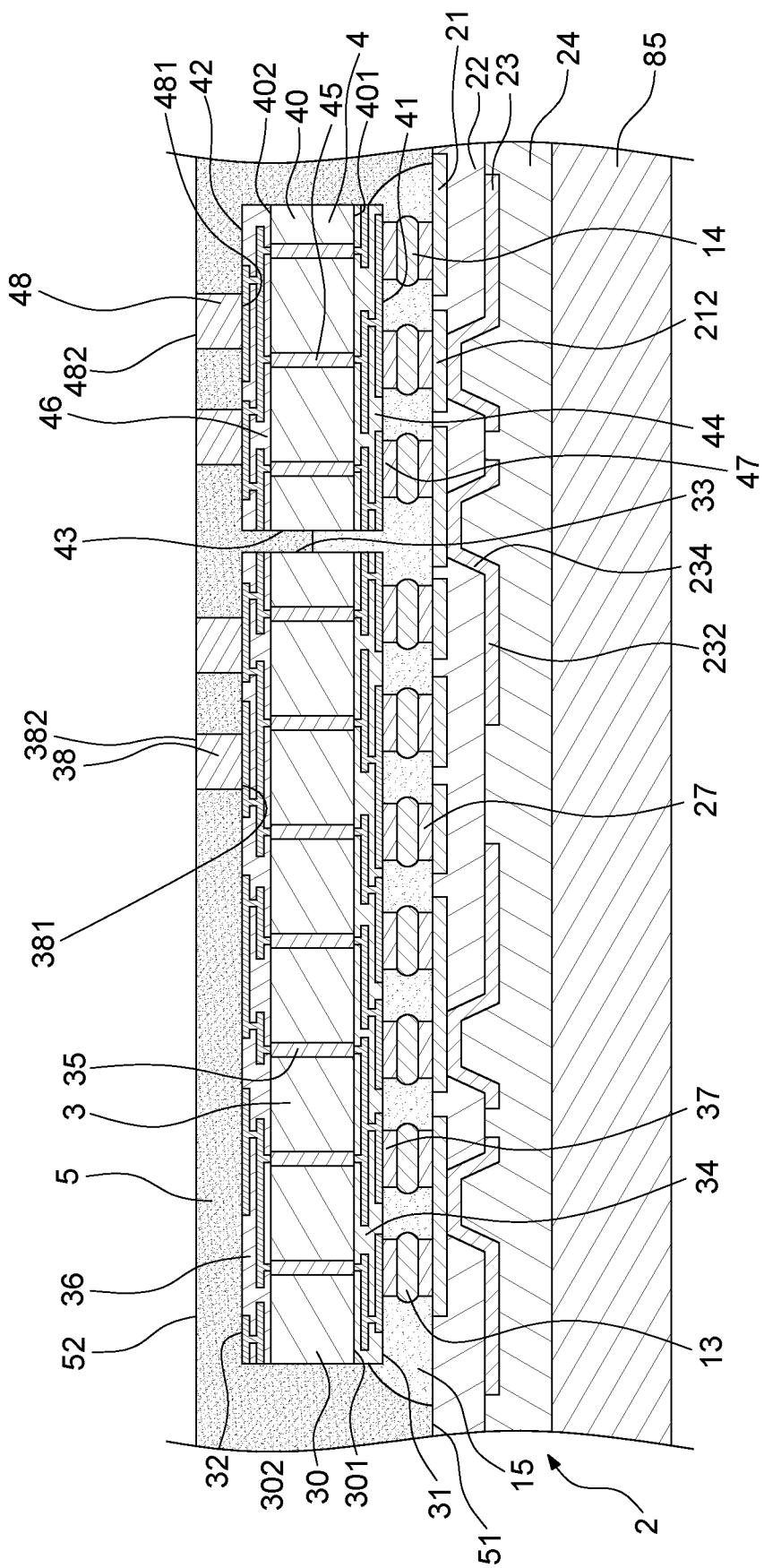
FIG. 14 illustrates one or more stages of an example of a method for manufacturing a semiconductor package structure according to some embodiments of the present disclosure.

Referring to FIG. 14, a portion (e.g., an upper portion) of the first encapsulant 5 is removed to expose the first conductive element 38 and the second conductive element 48. In some embodiments, the upper portion of the first encapsulant 5 is removed by grinding, thus forming a second surface 52 of the first encapsulant 5. The second surface 52 of the first encapsulant 5 is opposite to the first surface 51 thereof, and is an upper surface as shown in FIG. 14. For example, portions of the first conductive element 38 and the second conductive element 48 may also be removed during the grinding process, forming a second surface 382 of the first conductive element 38 and a second surface 482 of the second conductive element 48. The second surface 382 of the first conductive element 38 is opposite to the first surface 381 thereof, and is an upper surface as shown in FIG. 14. The second surface 482 of the second conductive element 48 is opposite to the first surface 481 thereof, and is an upper surface as shown in FIG. 14. Accordingly, the upper surface (e.g., the second surface 52) of the first encapsulant 5 is substantially coplanar with the upper surface (e.g., the second surface 382) of the first conductive element 38 and the upper surface (e.g., the second surface 482) of the second conductive element 48.

Figure 15:
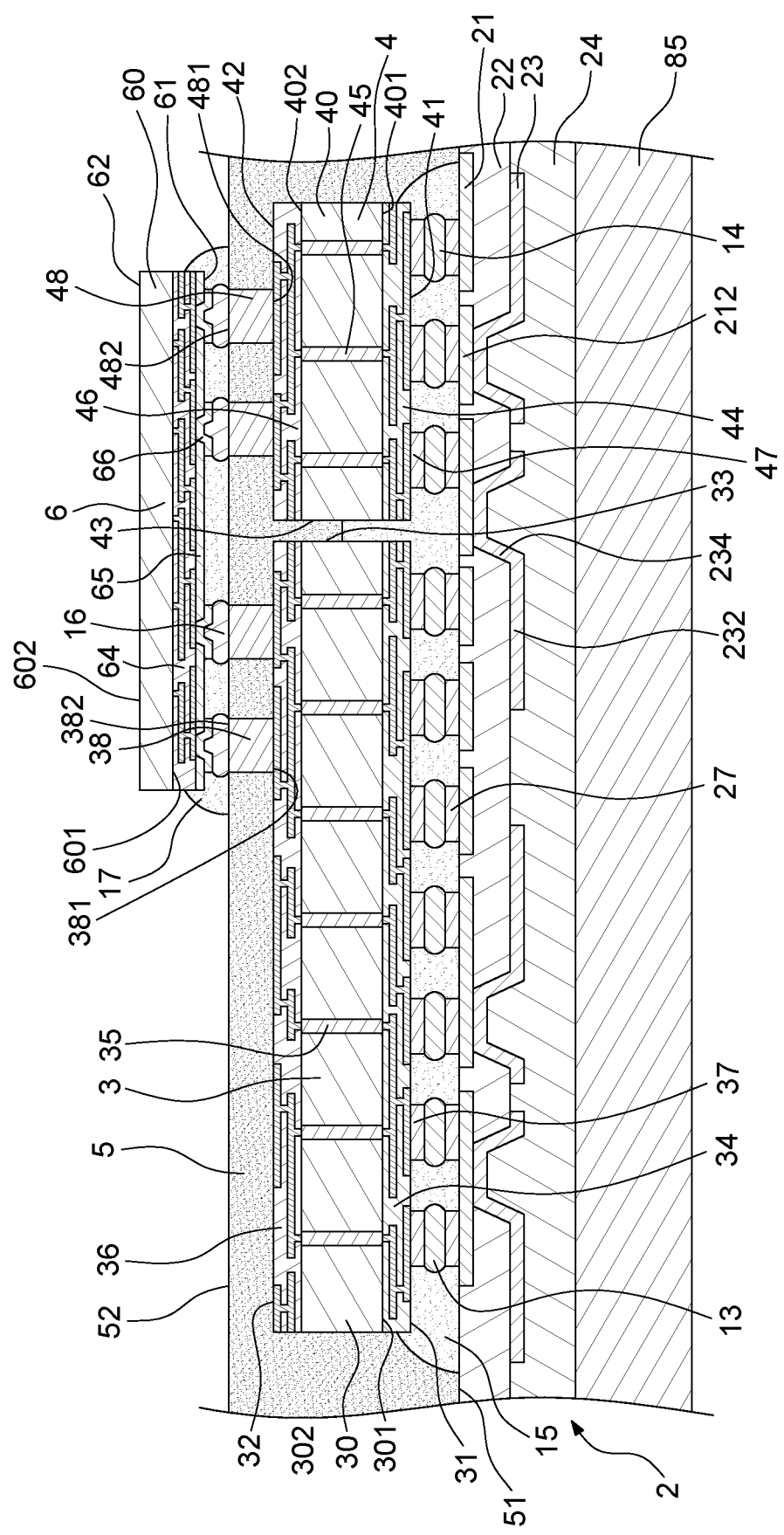
FIG. 15 illustrates one or more stages of an example of a method for manufacturing semiconductor package structure according to some embodiments of the present disclosure.

Referring to FIG. 15, an upper semiconductor chip 6 is disposed on the first encapsulant 5 to electrically connect the first conductive element 3 and the second conductive element 4. The upper semiconductor chip 6 has a first surface 61 and a second surface 62 opposite to the first surface 61. The first surface 61 faces the first encapsulant 5. The second surface 62 is an upper surface as shown in FIG. 15. The upper semiconductor chip 6 may include a main body 60, a circuit structure 64, a protection layer 65 and a plurality of UBMs 66. The main body 60 has a first surface 601 and a second surface 602 opposite to the first surface 601. The first surface 601 faces the first encapsulant 5. The second surface 602 of the main body 60 may be the second surface 62 of the upper semiconductor chip 6. The circuit structure 64 is disposed on the first surface 601 of the main body 60. The circuit structure 64 may include at least one redistribution layer. The protection layer 65 is disposed on and covers the circuit structure 64, and exposes portions of the circuit structure 64. The UBMs 66 are disposed on the exposed portions of the circuit structure 64. At least one of the UBMs 66 is connected to the first conductive element 38 through one of the third solder materials 16, thus the upper semiconductor chip 6 is electrically connected to the first semiconductor chip 3. At least another one of the UBMs 66 is connected to the second conductive element 48 through another one of the third solder materials 16, thus the upper semiconductor chip 6 is electrically connected to the second semiconductor chip 4. As shown in FIG. 15, the first conductive element 38 and the second conductive element 48 are covered and protected by the first encapsulant 5. If the upper semiconductor chip 6 may tilt during the die-mounting process, the upper semiconductor chip 6 may hit the first encapsulant 5 rather than the first conductive element 38 and the second conductive element 48. Even the upper semiconductor chip 6 may hit the first conductive element 38 and the second conductive element 48, the first conductive element 38 and the second conductive element 48 may not be damaged (such as crack or collapse).

Then, a second underfill 17 is disposed between the upper semiconductor chip 6 and the first encapsulant 5, and surrounds the UBMs 66 and the solder materials 16. Then, the carrier 85 may be removed to expose the second dielectric layer 24 of the conductive structure 2. A plurality of openings 242 may be formed through the second dielectric layer 24 of the conductive structure 2 to expose portions of the second conductive layer 24, such as the pads 232. The UBMs 25 are then formed in respective ones of the openings of the second dielectric layer 24 to contact the pads 232 of the second conductive layer 23. The solder balls 26 are formed on respective ones of the UBMs 25 for external connection. Then, a singulation process is conducted, thus forming the semiconductor package structure 1 as shown in FIG. 1.

In the aforementioned process, since the first encapsulant 5 is formed before disposing the upper semiconductor chip 6, the first encapsulant 5 can flow smoothly into the space between the first semiconductor chip 3 and the second semiconductor chip 4. Besides, the first encapsulant 5 protects the first conductive element 38 and the second conductive element 48 from damages when connecting the upper semiconductor chip 6 to the first conductive element 38 and the second conductive element 48.

Figure 16:
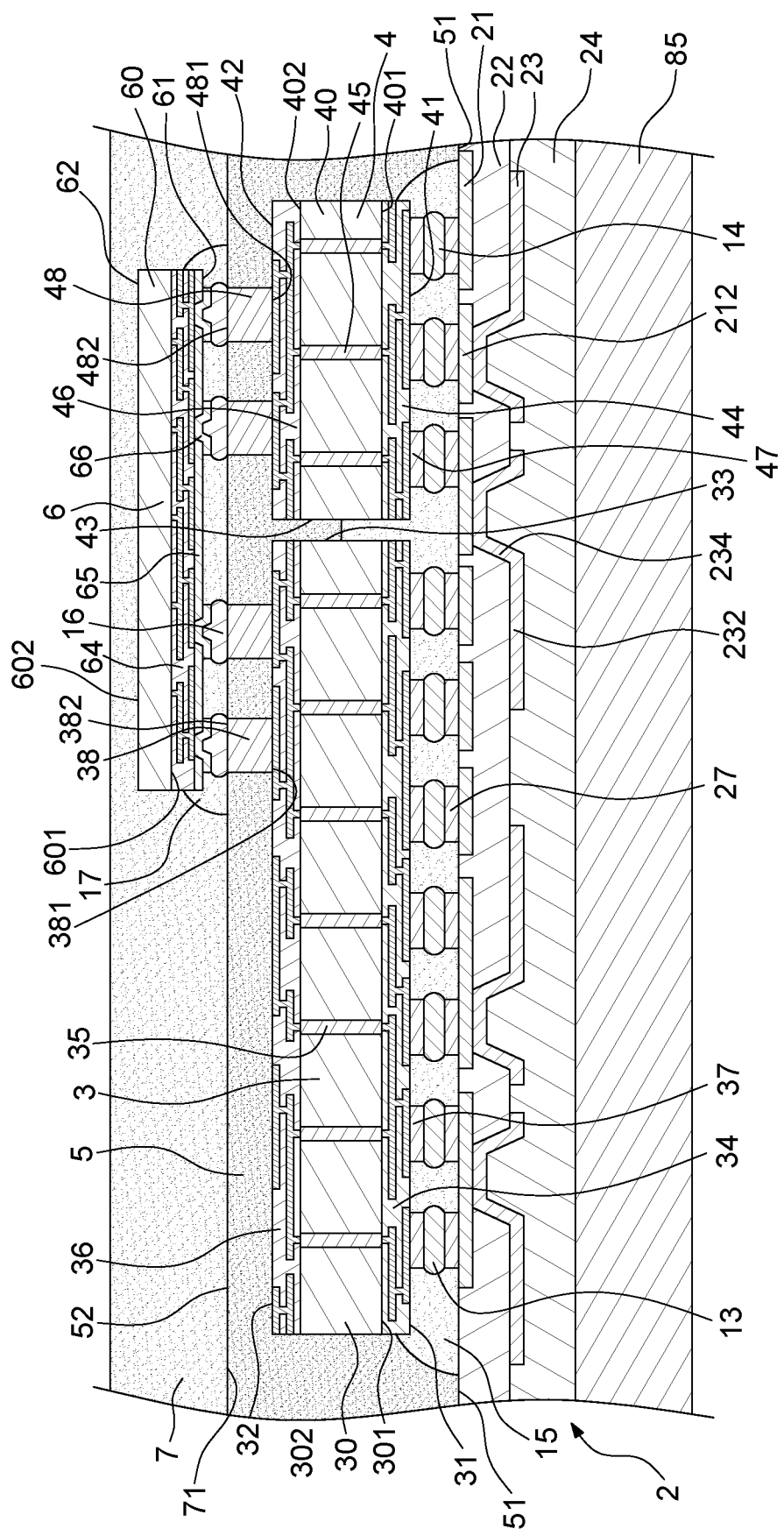
FIG. 16 illustrates one or more stages of an example of a method for manufacturing a semiconductor package structure according to some embodiments of the present disclosure.
Figure 17:
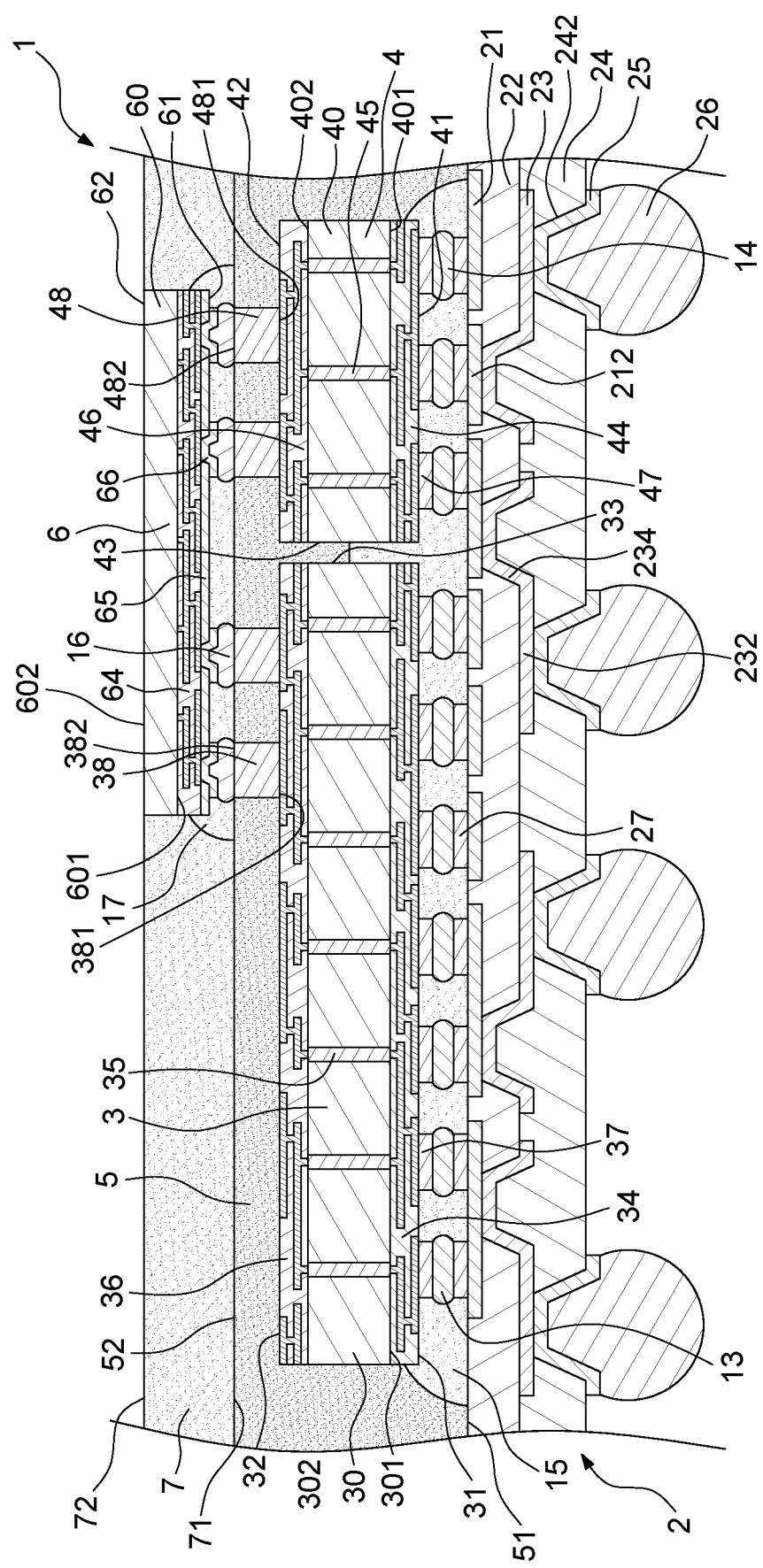
FIG. 17 illustrates one or more stages of an example of a method for manufacturing a semiconductor package structure according to some embodiments of the present disclosure.

FIG. 16 through FIG. 17 illustrate a method for manufacturing a semiconductor package structure according to some embodiments of the present disclosure. In some embodiments, the method is for manufacturing a semiconductor package structure such as the semiconductor package structure 1c shown in FIG. 5. The initial stages of the illustrated process are the same as, or similar to, the stages illustrated in FIG. 8 through FIG. 15. FIG. 16 depicts a stage subsequent to that depicted in FIG. 15.

Referring to FIG. 16, a second encapsulant 7 is formed on the first encapsulant 5 to cover the upper semiconductor chip 6 and the first encapsulant 5. The second encapsulant 7 has a first surface 71 disposed on the second surface 52 of the first encapsulant 5. The second encapsulant 7 completely covers the upper semiconductor chip 6. The CTE of the second encapsulant 7 may be the same as or different from the CTE of the first encapsulant 5. In some embodiments, the CTE of the second encapsulant 7 may be selected according to the warpage condition of the structure shown in FIG. 15, so as to balance such warpage.

Referring to FIG. 17, the second encapsulant 7 is grinded to expose the upper semiconductor chip 6, thus forming a second surface 72 of the second encapsulant 7. The second surface 72 of the second encapsulant 7 is opposite to the first surface 71 thereof, and is an upper surface as shown in FIG. 17. Accordingly, the upper surface (e.g., the second surface 72) of the second encapsulant is substantially coplanar with the upper surface (e.g., the second surface 62) of the upper semiconductor chip 6. Then, the carrier 85 may be removed to expose the second dielectric layer 24 of the conductive structure 2. A plurality of openings 242 may be formed through the second dielectric layer 24 of the conductive structure 2 to expose portions of the second conductive layer 24, such as the pads 232. The UBMs 25 are then formed in respective ones of the openings of the second dielectric layer 24 to contact the pads 232 of the second conductive layer 23. The solder balls 26 are formed on respective ones of the UBMs 25 for external connection. Then, a singulation process is conducted, thus forming the semiconductor package structure 1c as shown in FIG. 5.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
    a conductive structure;

a first semiconductor chip electrically connected to the conductive structure, wherein the first semiconductor chip has a first surface and a second surface opposite to the first surface, the first surface faces the conductive structure, and the first semiconductor chip comprises at least one first conductive element disposed adjacent to the second surface;

a second semiconductor chip electrically connected to the conductive structure and disposed next to the first semiconductor chip, wherein the second semiconductor chip has a first surface and a second surface opposite to the first surface, the first surface faces the conductive structure, and the second semiconductor chip comprises at least one second conductive element disposed adjacent to the second surface;

a first encapsulant disposed on the conductive structure, wherein the first encapsulant covers the first semiconductor chip and the second semiconductor chip, the first encapsulant contacts the first conductive element and the second conductive element, the first conductive element and the second conductive element are exposed from the first encapsulant, the first encapsulant includes a first portion and a second portion, the first portion is disposed on the second surface of the first semiconductor chip, the second portion covers a lateral surface of the first semiconductor chip, and the first portion and the second portion are formed integrally and concurrently; and an upper semiconductor chip disposed on the first encapsulant and electrically connected to the first conductive element and the second conductive element, wherein the upper semiconductor chip has an active surface facing the conductive structure, and the first semiconductor chip is disposed between the conductive structure and the upper semiconductor chip.

2. The semiconductor package structure of claim 1, wherein an upper surface of the first encapsulant is substantially coplanar with an upper surface of the first conductive element and an upper surface of the second conductive element.

3. The semiconductor package structure of claim 1, wherein a portion of the first encapsulant is disposed between the first semiconductor chip and the second semiconductor chip.

4. The semiconductor package structure of claim 1, wherein a thickness of the first semiconductor chip is not equal to a thickness of the second semiconductor chip.

5. The semiconductor package structure of claim 1, wherein the first conductive element and the second conductive element are conductive bumps.

6. The semiconductor package structure of claim 1, wherein the first conductive element and the second conductive element are solder balls.

7. The semiconductor package structure of claim 1, wherein the first encapsulant comprises a plurality of truncated fillers exposed on an upper surface of the first encapsulant.

8. The semiconductor package structure of claim 1, further comprising a second encapsulant disposed on the first encapsulant and covering the upper semiconductor chip and the first encapsulant, wherein the first encapsulant contacts the second encapsulant.

9. The semiconductor package structure of claim 8, wherein an upper surface of the second encapsulant is substantially coplanar with an upper surface of the upper semiconductor chip.

10. The semiconductor package structure of claim 1, wherein the conductive structure comprises at least one redistribution layer.

11. The semiconductor package structure of claim 1, wherein the upper semiconductor chip is a memory die or a bridge die.

12. The semiconductor package structure of claim 1, wherein the conductive structure includes an external connector disposed on a bottom surface of the conductive structure for external connection, and the first semiconductor chip is disposed between the conductive structure and the upper semiconductor chip.

13. The semiconductor package structure of claim 1, wherein the first encapsulant is a monolithic structure.

14. The semiconductor package structure of claim 1, wherein the first semiconductor chip includes a circuit structure, the first conductive element is disposed on the circuit structure, and the first encapsulant covers the circuit structure.

15. The semiconductor package structure of claim 1, further comprising an underfill disposed between the first semiconductor chip and the conductive structure, and between the second semiconductor chip and the conductive structure, wherein the underfill includes a portion disposed between the first semiconductor chip and the second semiconductor chip.

16. A semiconductor package structure, comprising:
a conductive structure;
a first semiconductor chip electrically connected to the conductive structure, wherein the first semiconductor chip has a first surface and a second surface opposite to the first surface, the first surface faces the conductive structure, and the first semiconductor chip comprises at least one first conductive element disposed on the second surface;
a first encapsulant disposed on the conductive structure and covering the first semiconductor chip, wherein the first encapsulant contacts the first conductive element, an upper surface of the first encapsulant is substantially coplanar with an upper surface of the first conductive element, the first encapsulant includes a first portion and a second portion, the first portion is disposed on the second surface of the first semiconductor chip, the second portion covers a lateral surface of the first semiconductor chip, and the first portion and the second portion are formed integrally and concurrently; and
an upper semiconductor chip disposed on the first encapsulant and electrically connected to the first conductive element, wherein the upper semiconductor chip has an active surface facing the conductive structure, and the first semiconductor chip is disposed between the conductive structure and the upper semiconductor chip.

17. The semiconductor package structure 16, wherein the first conductive element is a conductive bump or a solder ball.

18. The semiconductor package structure of claim 16, wherein the first encapsulant comprises a plurality of truncated fillers exposed on an upper surface of the first encapsulant.

19. The semiconductor package structure of claim 16, further comprising a second encapsulant disposed on the first encapsulant and covering the upper semiconductor chip and the first encapsulant, wherein the first encapsulant contacts the second encapsulant.

20. The semiconductor package structure of claim 16, wherein the conductive structure comprises at least one redistribution layer.

21. The semiconductor package structure of claim 16, wherein the upper semiconductor chip is a memory die or a bridge die.

22. The semiconductor package structure of claim 16, wherein the conductive structure includes an external connector disposed on a bottom surface of the conductive structure for external connection, and the first semiconductor chip is disposed between the conductive structure and the upper semiconductor chip.

23. The semiconductor package structure of claim 16, wherein the first encapsulant is a monolithic structure.

24. The semiconductor package structure of claim 16, wherein the first semiconductor chip includes a circuit structure, the first conductive element is disposed on the circuit structure, and the first encapsulant covers the circuit structure.

25. A method for manufacturing a semiconductor package structure, comprising:
  (a) providing a first semiconductor chip, a second semiconductor chip and a conductive structure, wherein the first semiconductor chip and the second semiconductor chip are electrically connected to the conductive structure, the second semiconductor chip is disposed next to the first semiconductor chip, the first semiconductor chip has a first surface and a second surface opposite to the first surface, the first surface faces the conductive structure, the second semiconductor chip has a first surface and a second surface opposite to the first surface, the first surface faces the conductive structure, the first semiconductor chip comprises at least one first conductive element disposed adjacent to the second surface, and the second semiconductor chip comprises at least one second conductive element disposed adjacent to the second surface;
  (b) forming a first encapsulant on the conductive structure to cover the first semiconductor chip, the second semiconductor chip, the first conductive element and the second conductive element, wherein the first encapsulant contacts the first conductive element and the second element, the first encapsulant includes a first portion and a second portion, the first portion is disposed on the second surface of the first semiconductor chip, the second portion covers a lateral surface of the first semiconductor chip, and the first portion and the second portion are formed integrally and concurrently;
  (c) removing a portion of the first encapsulant to expose the first conductive element and the second conductive element; and
  (d) disposing an upper semiconductor chip on the first encapsulant to electrically connect the first conductive element and the second conductive element, wherein the upper semiconductor chip has an active surface facing the conductive structure, and the first semiconductor chip is disposed between the conductive structure and the upper semiconductor chip.

26. The method of claim 25, wherein in (b), a portion of the first encapsulant extends into a space between the first semiconductor chip and the second semiconductor chip.

27. The method of claim 25, wherein in (c), the portion of the first encapsulant is removed by grinding, such that an upper surface of the first encapsulant is substantially coplanar with an upper surface of the first conductive element and an upper surface of the second conductive element.

28. The method of claim 25, further comprising:
  (e) forming a second encapsulant on the first encapsulant to cover the upper semiconductor chip and the first encapsulant.

29. The method of claim 28, further comprising:
  (g) grinding the second encapsulant, such that an upper surface of the second encapsulant is substantially coplanar with an upper surface of the upper semiconductor chip.

* * * * *